(12) United States Patent
Veres et al.

(10) Patent No.: US 9,353,932 B2
(45) Date of Patent: May 31, 2016

(54) LED LIGHT BULB WITH STRUCTURAL SUPPORT

(71) Applicant: Palo Alto Research Center Incorporated, Palo Alto, CA (US)

(72) Inventors: Janos Veres, San Jose, CA (US); Philipp Schmaelzle, Los Altos, CA (US); Christopher Paulson, Livermore, CA (US); Ashish Pattekar, Cupertino, CA (US); Patrick Yasuo Maeda, San Jose, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 403 days.

(21) Appl. No.: 13/802,315

(22) Filed: Mar. 13, 2013

(65) Prior Publication Data

US 2014/0268739 A1 Sep. 18, 2014

(51) Int. Cl.
| | |
|---|---|
| *F21V 21/00* | (2006.01) |
| *F21V 29/00* | (2015.01) |
| *F21K 99/00* | (2016.01) |
| *F21V 7/00* | (2006.01) |
| *F21V 19/00* | (2006.01) |

(Continued)

(52) U.S. Cl.
CPC .................. *F21V 21/00* (2013.01); *F21K 9/135* (2013.01); *F21V 7/0066* (2013.01); *F21V 19/001* (2013.01); *F21V 29/83* (2015.01); *F21Y 2101/02* (2013.01); *F21Y 2111/001* (2013.01); *H05K 1/189* (2013.01); *H05K 3/0058* (2013.01); *H05K 2201/056* (2013.01); *H05K 2201/10106* (2013.01); *Y10T 29/4913* (2015.01)

(58) Field of Classification Search
CPC ..... F21K 9/135; F21V 7/0066; F21V 19/001; F21V 21/00; F21V 29/74; F21V 29/83; F21Y 2101/02; F21Y 2111/001; H05K 1/189; H05K 3/0058; H05K 2201/056; H05K 2201/10106; Y10T 29/4913
USPC ............ 362/249.02–249.06, 216, 294; D26/2
See application file for complete search history.

(56) References Cited

U.S. PATENT DOCUMENTS

| | | |
|---|---|---|
| 6,580,228 B1 | 6/2003 | Chen et al. |
| 7,086,756 B2 | 8/2006 | Maxik |

(Continued)

FOREIGN PATENT DOCUMENTS

| | | |
|---|---|---|
| JP | 2010218714 | 9/2010 |
| WO | WO2011132343 | 10/2011 |

OTHER PUBLICATIONS

Su et al. "Thermal properties of phthalic anhydride- and phenolic resin-cured rigid rod epoxy resins", Thermochimica Acta, 392-393, 2002, pp. 395-398.

(Continued)

*Primary Examiner* — Stephen F Husar
(74) *Attorney, Agent, or Firm* — Hollingsworth Davis, LLC

(57) ABSTRACT

A light emitting diode (LED) light bulb includes a base and at least one support structure coupled to the base. The support structure is formed into a shape that defines contours for a luminous surface and an open volume. The LED light bulb includes least one LED assembly comprising two or more electrically connected LEDs. The LED assembly is attached to and in physical contact with the support structure along a length of the support structure to form the luminous surface. The support structure has openings between neighboring segments of the LED assembly.

19 Claims, 24 Drawing Sheets

(51) Int. Cl.
*F21V 29/83* (2015.01)
*H05K 1/18* (2006.01)
*F21Y 101/02* (2006.01)
*F21Y 111/00* (2016.01)
*H05K 3/00* (2006.01)

(56) References Cited

U.S. PATENT DOCUMENTS

| | | | |
|---|---|---|---|
| 7,108,396 B2 * | 9/2006 | Swaris et al. | 362/249.06 |
| 7,804,099 B2 * | 9/2010 | Beeson | H01L 33/42 257/89 |
| 7,923,272 B2 | 4/2011 | Lee | |
| 2003/0076041 A1 * | 4/2003 | Honda et al. | 313/634 |
| 2006/0262551 A1 * | 11/2006 | Fallahi et al. | 362/518 |
| 2010/0220472 A1 | 9/2010 | Dahm | |
| 2011/0001157 A1 | 1/2011 | McKenzie et al. | |
| 2011/0037412 A1 | 2/2011 | Kim | |
| 2011/0050073 A1 | 3/2011 | Huang | |
| 2011/0156584 A1 * | 6/2011 | Kim | 315/32 |
| 2011/0163683 A1 * | 7/2011 | Steele et al. | 315/192 |
| 2011/0210349 A1 | 9/2011 | Pan | |
| 2011/0260945 A1 | 10/2011 | Karasawa | |
| 2011/0267812 A1 | 11/2011 | Van de Ven et al. | |
| 2011/0316006 A1 | 12/2011 | Xu | |
| 2012/0025247 A1 | 2/2012 | Ooyabu et al. | |
| 2012/0243212 A1 | 9/2012 | Smith et al. | |
| 2012/0281407 A1 | 11/2012 | Sinofsky | |
| 2014/0268740 A1 * | 9/2014 | Veres et al. | 362/235 |

OTHER PUBLICATIONS

NthDegree Product Info for Flat Panel Light printed from http://www.nthdegreetech.com/printed-lights-info.php on Jan. 30, 2013, 2 pages.
File History for U.S. Appl. No. 13/802,343.

* cited by examiner

LED LIGHT BULB WITH STRUCTURAL SUPPORT

TECHNICAL FIELD

This application relates generally to light emitting diode (LED) light bulbs. The application also relates to components, devices, and systems pertaining to such LED light bulbs.

SUMMARY

Some embodiments involve a light emitting diode (LED) light bulb. The LED light bulb includes a base and at least one support structure coupled to the base and formed into a shape that defines contours for a luminous surface and an open volume. The LED light bulb includes least one LED assembly comprising two or more electrically connected LEDs. The LED assembly is attached to and in physical contact with the support structure along a length of the support structure to form the luminous surface. The support structure has openings between neighboring segments of the LED assembly. According to some implementations, the volume defined by the luminous surface has a sphericity greater than about 0.7. In some implementations, the LED light bulb provides a light output per surface area preferably between about 0.3 lumens and 30 lumens per $cm^2$ of the exterior surface area of the LED light bulb and more preferably between about 0.5 lumens and 20 lumens per $cm^2$ of the exterior surface area of the LED light bulb.

For example, the dimensions of the LED light bulb may be similar to an incandescent light bulb of equivalent luminosity. The LED light bulb can have any shape, e.g., spiral, cylindrical, conical, etc. In some configurations, the LED light bulb may comprise multiple elongated support elements and multiple LED assemblies, where each of the multiple LED assemblies is attached to a respective one of the multiple elongated support elements. Alternatively, the LED assembly may comprise a single elongated support element, the single elongated support element coupled to a single LED assembly or to multiple LED assemblies.

The support structure can comprise a metal, which may be anodized and/or oxidized, and/or otherwise coated. The support structure can comprise a plastic, e.g., a molded plastic. In some implementations, the support structure comprises a composite of several materials. The support structure may comprise a material that has a thermal conductivity greater than about 100 W/mK. Cooling fins configured to dissipate heat generated by the LEDs are optionally provided on the support structure. In various implementations, the cooling fins can be oriented outside and/or inside the open volume. According to some configurations, at least one major surface of the support structure has a surface texture that provides a surface area at least three times greater than an untextured surface of the same size. The support structure can have a light scattering surface. According to some configurations, the support structure has a reflectivity greater than about 85% for wavelengths between about 320 nm and 700 nm. In some embodiment, the support structure may comprise a cured structural coating.

In some configurations, the LED assembly comprises a plurality of LEDs arranged in a single row along a length of a flexible substrate. Alternatively, the LED assembly may comprise a plurality of LEDs arranged in two or more rows along a length of a flexible substrate. The LEDs can be electrically connected, e.g., in parallel, with the electrical connections between the LEDs disposed in or on the flexible substrate. flexible substrate has a first major surface and an opposing a second major surface and each of the LEDs has a light emitting surface or edge that is substantially perpendicular to major surface of the flexible substrate.

In some implementations, the LED assembly comprises a flexible substrate that has a first major surface and an opposing second major surface. Each of the LEDs has a light emitting surface or edge that is substantially parallel to major surface of the flexible substrate. In some implementations, the support structure has a first major surface and an opposing second major surface. The LED assembly is disposed on the first major surface of the elongated support structure. Alternatively, at first LED assembly can be disposed along the first major surface of the elongated support and a second LED assembly can be disposed along the second major surface of the elongated support.

In some implementations, the LED assembly substrate comprises a flexible printed circuit board and the LEDs comprise discrete surface mount LEDs. In some implementations, the LEDs comprise micro LEDs that are formed together as an integrated circuit.

A coating may be disposed over at least a portion of the LED assembly. The coating may comprise one or more of ceramic, glass, polymer, plastic, and metal powder. In some configurations, the coating is configured to transmit and/or scatter light generated by the LEDs. The coating may serve as a lens configured to direct the light emitted by the LEDs. In some cases a coating may have a surface that is exposed to ambient air. For example, the coating surface can have a surface texture that provides a surface area at least three times greater than an untextured surface of the same size. The LED light bulb may include at least one thermally diffusive layer or coating disposed on the support structure.

According to some aspects, an optical sheet may be disposed over the LEDs. In some cases, the optical sheet can be configured to diffuse the light emitted by the LEDs. In some cases, the optical sheet can be configured to guide the light emitted by the LEDs along a path through the optical sheet before transmitting the light out of the optical sheet. For example, the optical sheet can be embedded in a coating disposed over the LED assembly.

In some implementations, a first group of the LEDs is electrically coupled to provide relatively lower light output and a second group of the LEDs is electrically coupled to provide relatively higher light output.

Some embodiments are directed to methods of making a light emitting diode (LED) light bulb. A support structure is formed into a predetermined shape. The predetermined shape defines contours of a luminous surface and an open volume. At least one LED is attached to the support structure, the LED assembly comprises a substrate and a plurality of electrically connected LEDs spaced apart along the substrate.

In some cases the support structure is formed into the predetermined shape before attaching the at least one LED assembly. Alternatively, the LED assembly may be attached before the support structure is formed into the predetermined shape. Forming the support structure into the predetermined shape may comprise at least one of extruding, folding, bending, molding, and curing. According to some aspects, the luminous surface defines a volume that has a sphericity of greater than about 0.7.

A coating can be applied to a surface of one or both of the support structure and the LED assembly. The surface of the coating and/or support structure may be treated. The treatment imparts a texture to the surface that provides a surface area at least three times greater than an untreated surface of the same size. According to some implementations, an optical layer or sheet can be arranged over a light emitting surface of the LEDs. The optical layer or sheet may include a material that provides one or more of light transmission, reflection and diffusion. According to some implementations, a thermally diffusive layer can be disposed on one or both of a major surface of the LED assembly and a major surface of the structural support.

DESCRIPTION OF VARIOUS EMBODIMENTS

Figure 1A:
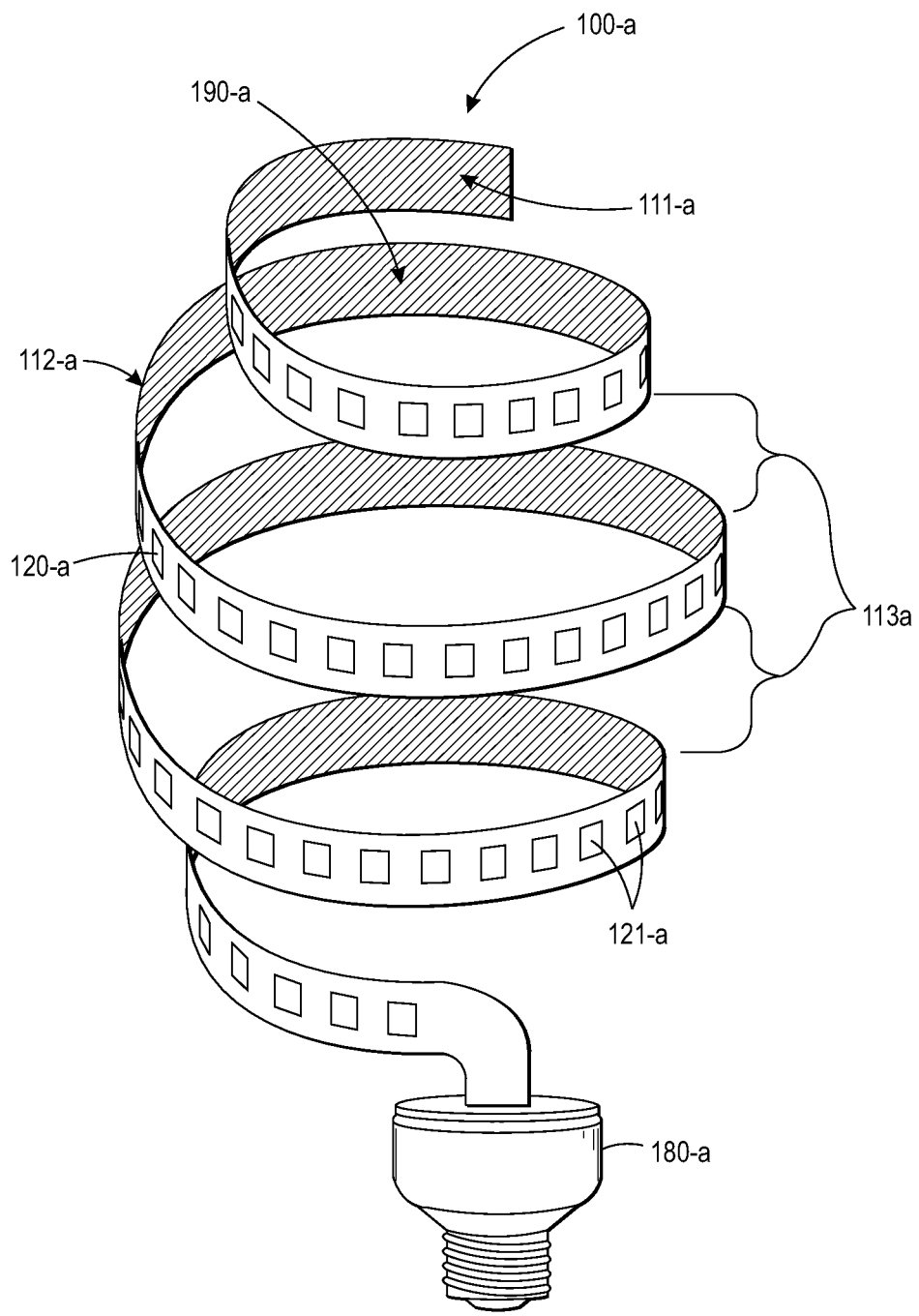
FIGS. 1A-1L illustrate various shapes of some LED light bulbs that can be formed according to the approaches discussed herein.

Solid state lighting is gaining attention due to the need for energy efficient light sources. Light emitting diode (LED) light bulbs can substantially increase residential and commercial energy efficiency if they achieve sufficient market adoption. However, commercially available designs are presently limited to 60 Watt-equivalent (We) luminosity. Market adoption is hindered by the lack of LED bulbs capable of replacing the common 75 W and 100 W incandescent bulbs to consumer satisfaction. Thermal management is a primary technology barrier to achieving higher luminosity in current LED bulb designs. Although LEDs are more efficient than incandescent light sources, the LED chips still generate substantial amount of heat, which needs to be dissipated. LED bulbs can be made of a number of small LED chips. Thermal management can be difficult when many LED chips are mounted in an LED bulb in close proximity. Approaches to deal with thermal management rely on heat sinks that add significant volume, weight, and cost to the bulbs. To improve heat dissipation, LED chips can be mounted further apart; however, placement of multiple discrete chips on several facets of a light source may involve a complex assembly process.

In-line manufacturing of LED assemblies is an efficient process. The LED assemblies include a number of LEDs disposed along an elongated substrate, which may be flexible. Various embodiments discussed herein provide processes for forming LED lighting devices and/or bulbs using LED assemblies. Some designs discussed herein include features or structures that provide thermal management and/or light management of the LED lighting device or bulb. Features and processes discussed herein are applicable to a variety of LED lighting devices and are particularly applicable to LED light bulbs, such as incandescent replacement LED light bulbs that have a standard screw-in Edison base electrical connector. The term "LED light bulb" as used herein refers to a lighting device that has a form factor of any standard incandescent light bulb. An LED light bulb as described herein provides a light output per surface area preferably between about 0.3 lumens and 30 lumens per $cm^2$ of the exterior surface area of the LED light bulb and more preferably between about 0.5 lumens and 20 lumens per $cm^2$ of the exterior surface area of the LED light bulb.

Some embodiments discussed herein are directed to LED bulbs that include a support structure and one or more LED assemblies arranged along the support structure. The LED assemblies comprise a plurality of electrically connected LEDs. The support structure can be formed so that it holds the LED assemblies in a predetermined shape. The shapes can be selected to provide a specified air flow through the LED bulb and/or to obtain a specified light distribution.

Some embodiments discussed herein are directed to light emitting devices, e.g., LED light bulbs, formed using a curable coating. The light emitting devices comprise one or more LED assemblies that include two or more electrically connected LEDs. The LED assemblies are formed into a predetermined shape. A curable coating is applied to the one or more LED assemblies and is cured. The curable coating may be applied before or after the LED assemblies are shaped into the predetermined shape.

FIGS. 1A-1L illustrate various LED light bulbs 100-*a*-100-*l* that exemplify the approaches discussed herein. Each LED light bulb 100*a*-*l* includes a base 180-*a*-180-*l* that has an electrical connector, e.g., an electrical connector suitable for coupling to a household power supply. In some embodiments, the LED light bulb 100-*a*-100-*l* may include power conditioning circuitry, such as transformers, rectifiers, capacitors, AC to DC and/or DC to DC power converters, and the like, installed within the base 180-*a*-180-*l*. In some embodiments, the power conditioning circuitry may be external to the LED light bulb 100-*a*-100-*l*. Power connections are disposed on the base 180-*a*-180-*l* and the connector portion of the base may have the form of an Edison screw-in type light bulb base or other standard light bulb base. The LED light bulb 100-*a*-100-*l* comprises at least one support structure 111-*a*-111-*l* coupled to the base 180-*a*-180-*l*. The at least one support structure 111-*a*-111-*l* is formed into a predetermined shape that defines contours for a luminous surface 112-*a*-112-*l* with an open volume 190-*a*-190-*l*. The luminous surface 112-*a*-112-*l* of the LED light bulb 100-*a*-100-*l* provides a light output per surface area preferably between about 0.3 lumens and 30 lumens per $cm^2$ of the exterior surface area of the LED light bulb and more preferably between about 0.5 lumens and 20 lumens per $cm^2$ of the exterior surface area of the LED light bulb.

The overall dimensions of the LED light bulb 100-*a*-100-*l* may be similar to an incandescent light bulb of equivalent luminosity. The open volume 190-a-190-l serves to allow air flow through the LED light bulb 100-a-100-l which cools the LEDs 121-a-121-l.

The LED light bulb 100-a-100-l includes one or more LED assemblies 120-a-120-l, each flexible LED assembly comprising two or more electrically connected LEDs 121-a-121-l. The one or more LED assemblies 120-a-120-l, which may be flexible and/or elongated and/or linear, are attached to and are in physical contact with the support structure 111-a-111-l along a length of the support structure 111-a-111-l. The support structure 111-a-111-l has openings 113-a-113-l between neighboring segments of the one or more LED assemblies 120-a-120-l. The openings 113-a-113-l allow ambient air to flow into the open volume 190-a-190-l between neighboring segments of the one or more LED assemblies 120-a-120-l. The air flow between the neighboring segments can serve to cool the LEDs 121-a-121-l.

In some cases, the one or more LED assemblies 120-a-120 l may be attached to the support structure 111-a-111-l on the outside of the support structure 111-a-111-l (i.e., outside the open volume 190a-190 l). In some cases, the one or more LED assemblies 120-a-120-l may be attached to the support structure 111-a-111-l on the inside of the support structure 111-a-111-l (i.e., inside the open volume 190-a-190-l). The one or more LED assemblies 120-a-120-l may be attached to the support structure 111-a-111-l on the outside and on inside of the support structure 111-a-111-l.

In some configurations, the support structure 111-a-111-l has a first major surface and an opposing second major surface. The one or more LED assemblies 120-a-120-l are disposed on the first major surface of the elongated support structure. In some configurations, the one or more LED assemblies 120-a-120-l comprises at least a first LED assembly disposed along the first major surface and at least a second LED assembly disposed along a the second major surface of the support structure.

In some configurations, the support structure comprises an elongated structure having a first end and a second end and the first and second ends are directly attached to the base. In some alternate configurations, the first end is directly attached to the base and the second end is spaced apart from the base.

Figure 1B:
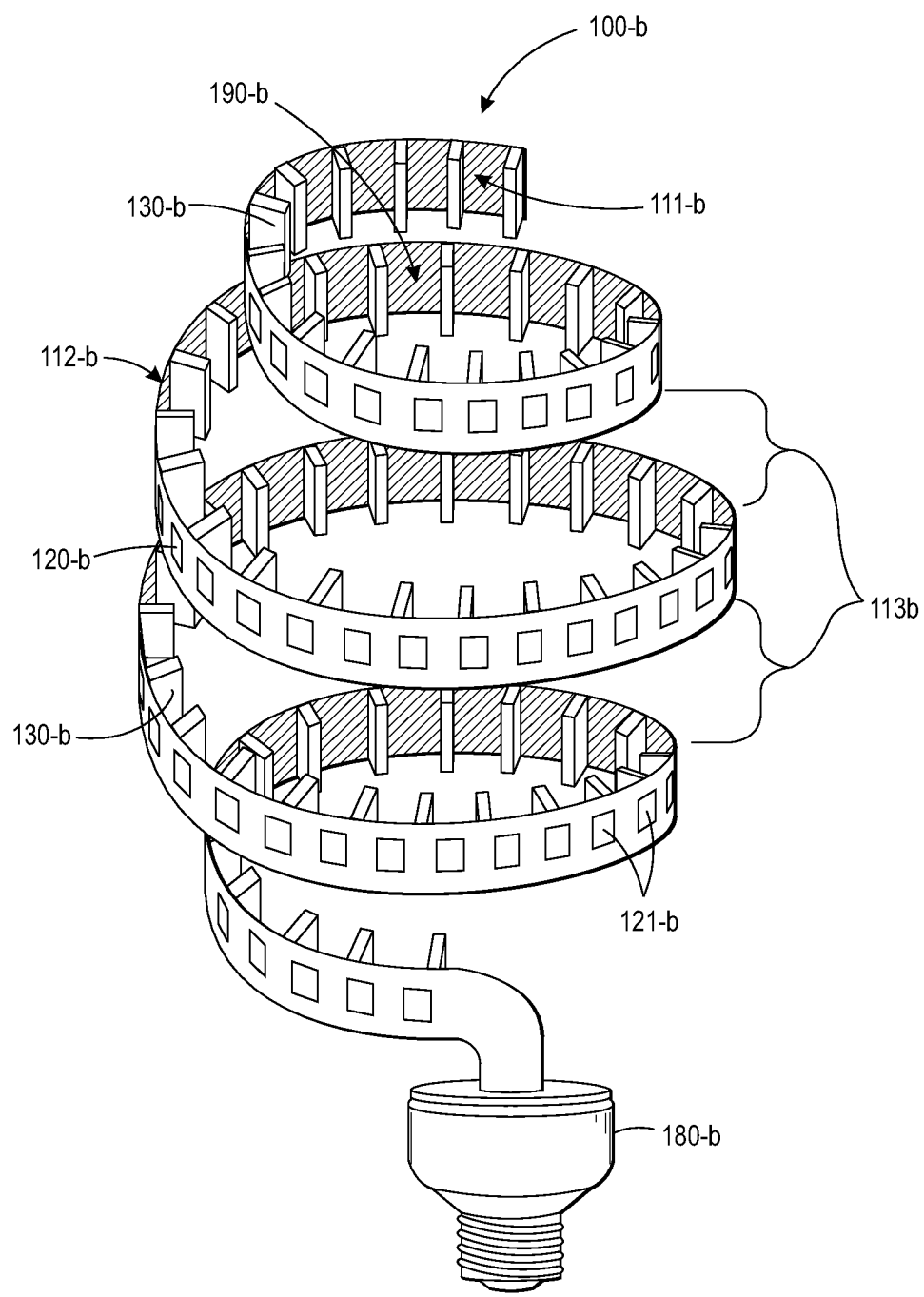

FIGS. 1A and 1B illustrate embodiments wherein the support structure 111-a-111-b is shaped into a spiral structure. In some cases, the support structure may be a single, continuous element and in some cases, the support structure may comprise multiple discrete support elements. The support structure can be a solid shape that has holes cut or formed in it; the support structure can be a frame with spaces between the frame elements; the support structure can be a mesh, for example. A single continuous LED assembly having interconnected LEDs 121-a-121-l may be disposed on a continuous or discrete element support structure. In some embodiments, multiple LED assemblies may be disposed on a continuous or discrete element support structure. In some embodiments, as shown in FIGS. 1A, 1B, 1G, 1H, the luminous volume (shape) defined by the surface 112-a, 112-b, 112-g, 112-h defined by the support structure 111-a, 111-b, 111-g, 111-h, 111-k, 111-l may have a sphericity greater than about 0.5 or even greater than about 0.7.

Figure 1C:
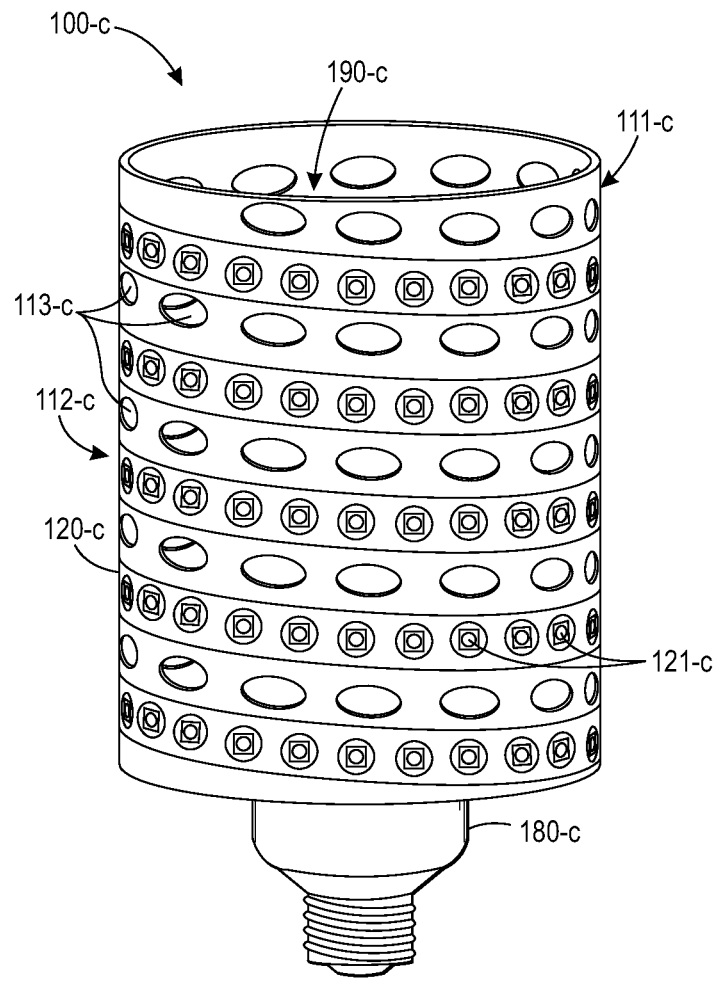
Figure 1D:
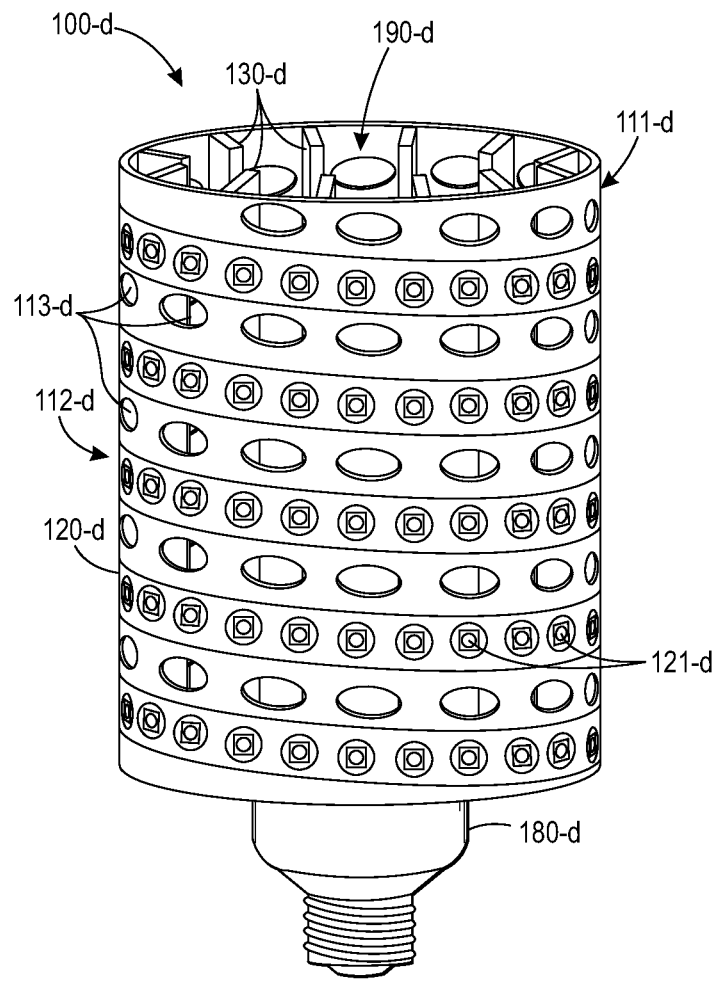
Figure 1E:
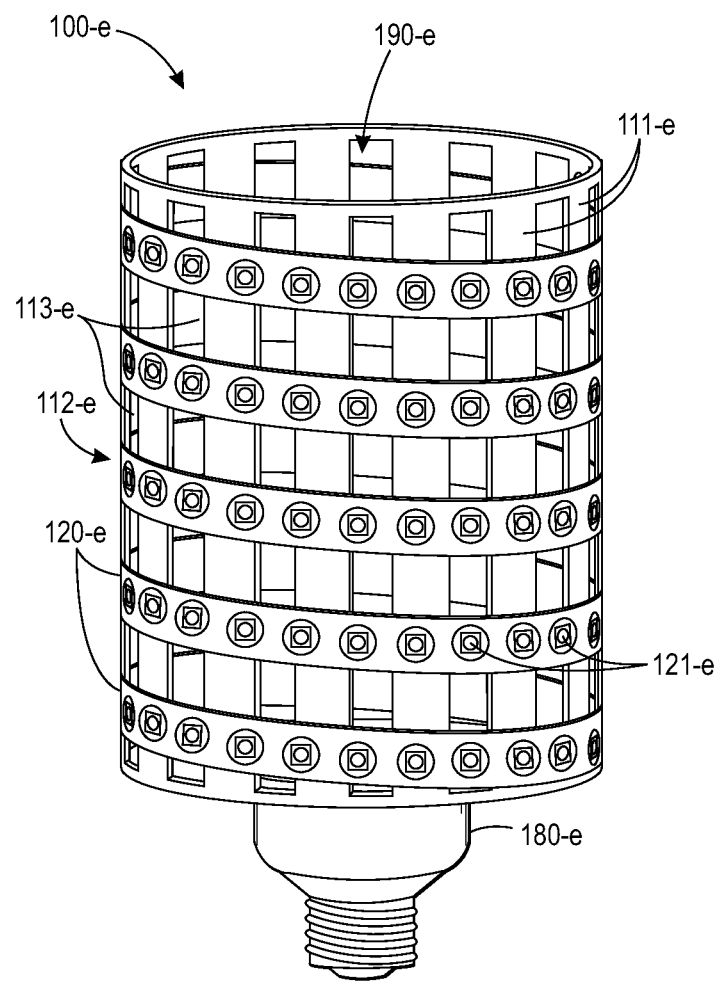
Figure 1F:
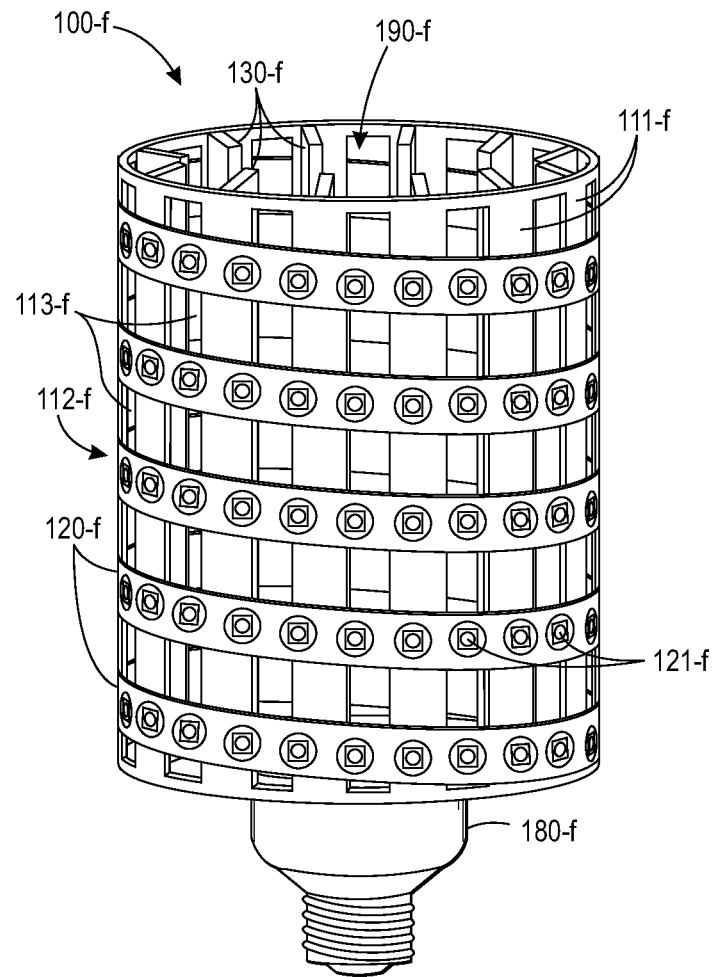
Figure 1G:
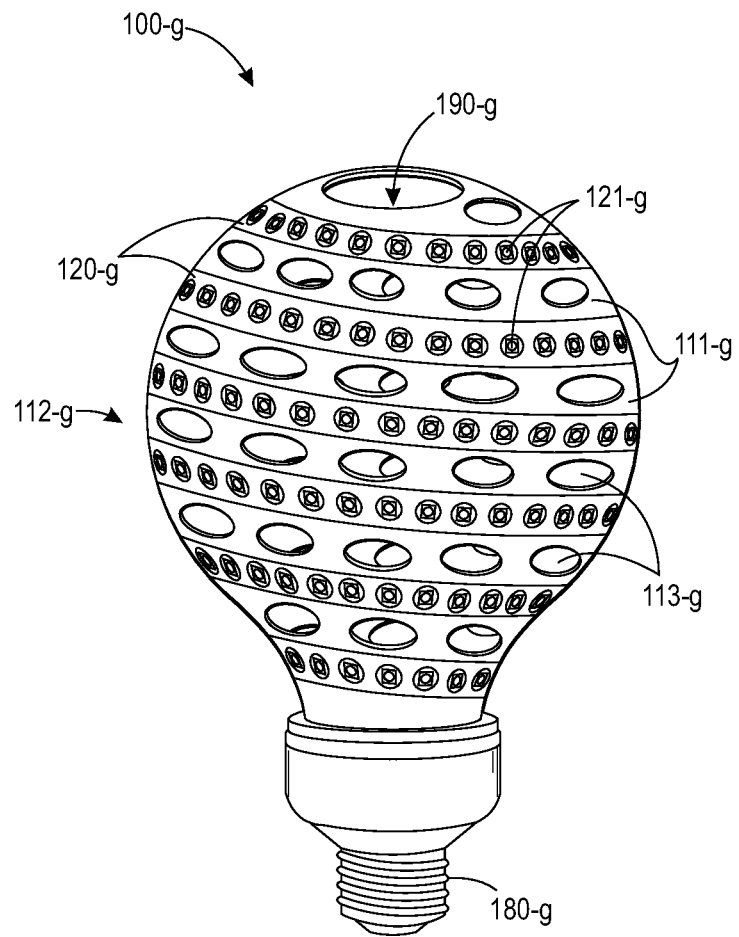

In some embodiments, the support structure may be cylindrical, as shown in FIGS. 1C-1F. As depicted in FIGS. 1C and 1D, the openings 113-c, 113-d may be holes in the cylindrical support 111-c, 111-d. As depicted in FIGS. 1E, 1F, the support structure 111-e, 111-f may be a cylindrical frame and the openings 113-e, 113-f are spaces between the frame elements.

Figure 1H:
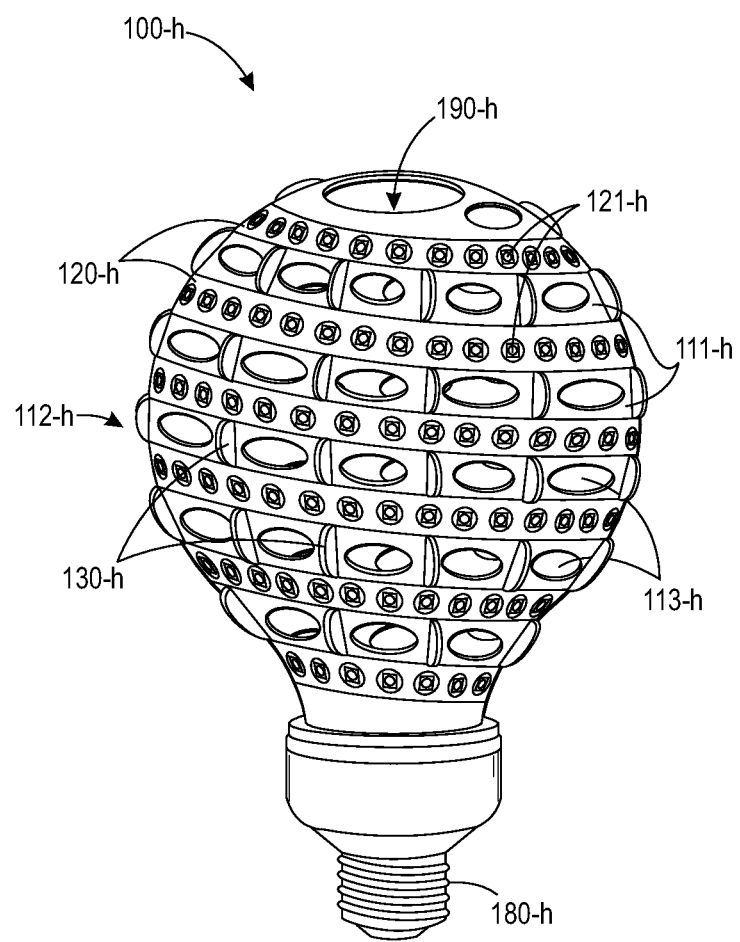
Figure 1I:
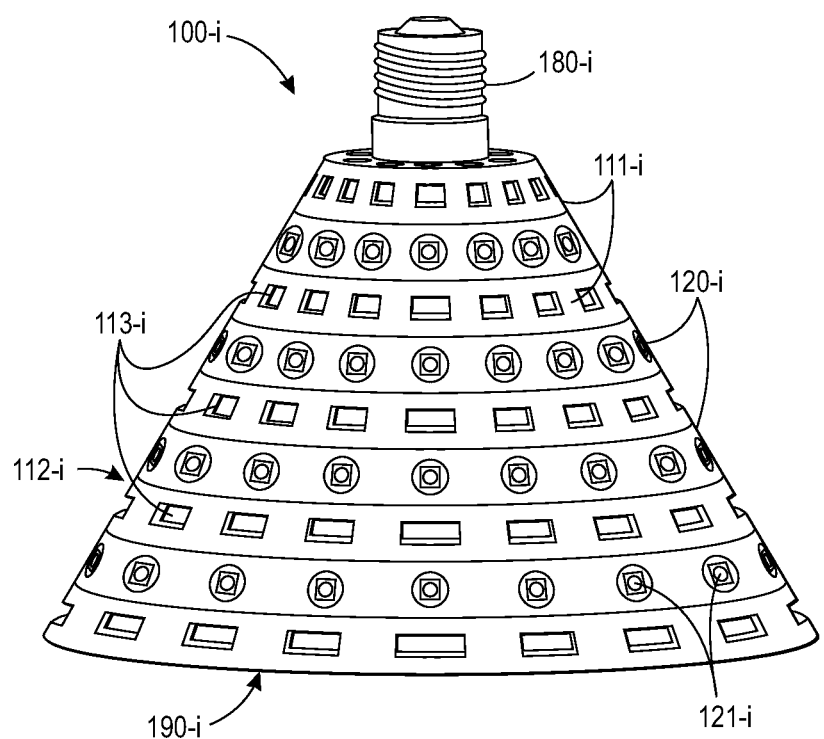
Figure 1J:
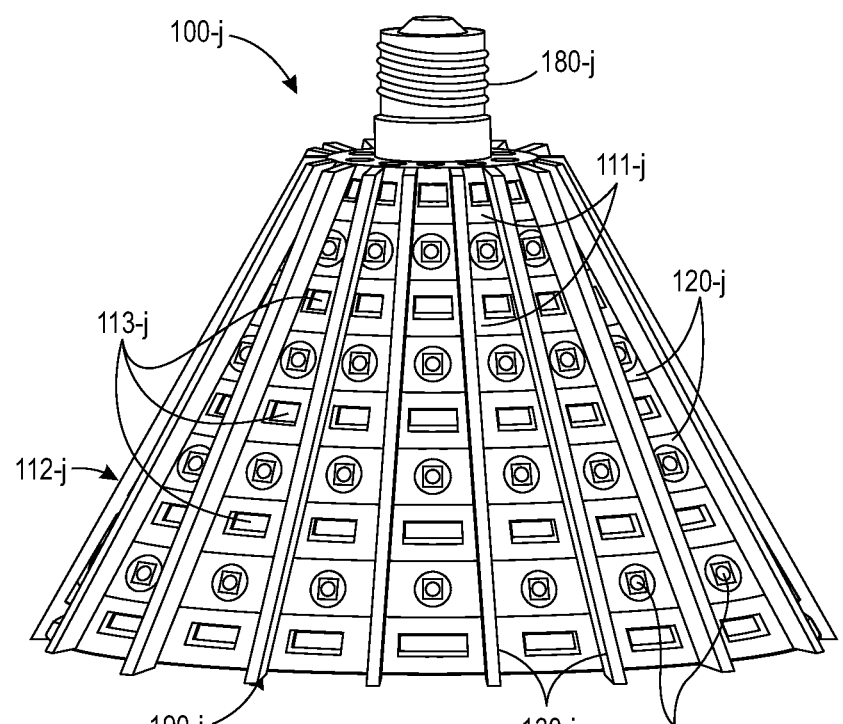

In some embodiments, as illustrated in FIGS. 1I and 1J, the support structure 111-i, 111-j may define a conical shape. In some embodiments, shown in FIGS. 1K and 1L, the support structure 111-k, 111-l may be formed of a mesh. The LED assemblies 120-k, 120-l may comprise micro LEDs.

The support structure 111-a-111-l provides the shape and rigidity for the LED light bulb 100-a-100-l and can also impart thermal and/or optical characteristics to the LED light bulb 100-a-100-l. The support structure may be made of metal, plastic, molded plastic, and/or a composite of several materials. In embodiments wherein the support structure is or includes a metal, the metal may be anodized, oxidized or otherwise coated with an appropriate coating material.

According to some implementations, the support structure comprises a cured structural coating. The cured structural coating may comprise a thermosetting material, a radiation cured material, e.g., a UV-cured material such as a UV cured polymer or UV—setting epoxy. The cured coating may comprise metal particles, such as mica, silver, gold and/or copper particles.

In embodiments that include a cured structural coating, the structural coating can be configured to dissipate heat generated by the LEDs. The cured structural coating may be disposed over at least a portion of the LEDs and configured to transmit the light generated by the LEDs. In some cases, the cured coating forms a lens that directs light emitted by the LEDs. The cured structural coating can have a surface that is exposed to ambient air (inside or outside the open volume) that has a surface texture with an effective surface area at least three times greater than an untextured surface of the same size.

The support structure 111-a-111-l can have a thermal conductivity greater than about 100 W/mK, greater than about 250 W/mK, or even greater than about 300 W/mK. In some embodiments, as shown in FIGS. 1B, 1D, 1F, 1H, 1J, 1L, the support structure 111-b, 111-d, 111-f, 111-h, 111-j, 111-l may have cooling structures 130-b, 130-d, 130-f, 130-h, 130-j, 130-l, e.g., cooling fins, configured to dissipate the heat generated by the LEDs. The cooling structures can be disposed on the outside of the support structure (i.e., outside the open volume) as shown in FIGS. 1H and 1J and/or can be disposed on the inside of the support structure (i.e., inside the open volume) as illustrated in FIGS. 1B, 1D, 1F, 1L.

In some embodiments, at least one major surface of the support structure has a surface texture that provides a surface area at least three times greater than an untextured surface of the same size and shape. Texturing of the support structure surface can be used to impart certain optical and/or thermal properties to the support structure.

In some embodiments, the support structure has a reflectivity greater than 85% for visible light, e.g., wavelengths between about 320 nm and 700 nm. The support structure can comprise a material and/or have a surface texture that is configured to scatter light emitted by the LEDs 121-a-121-l.

Each of the LED light bulbs 100-a-100-l include one or more LED assemblies 120-a-120-l comprising a plurality of electrically interconnected LEDs 121-a-121-l. In some embodiments, each LED subassembly comprises a substrate, e.g., a flexible substrate, having a plurality of LEDs arranged thereon. For example, the LEDs may be arranged in a single row or two or more rows along a length of the substrate. The LEDs can be electrically connected in series or in parallel. The substrate of an LED assembly has a first major surface and an opposing major surface. In some implementations, each of the LEDs 121-a-121-l can have a light emitting surface or edge that is substantially perpendicular to a major surface of the substrate. In some implementations, each of the LEDs 121-a-121-l can have a light emitting surface or edge that is substantially parallel to major surface of the substrate.

According to some aspects, a first group of the LEDs can be electrically coupled to provide relatively lower light output and a second group of the LEDs electrically coupled to provide relatively higher light output.

Figure 1K:
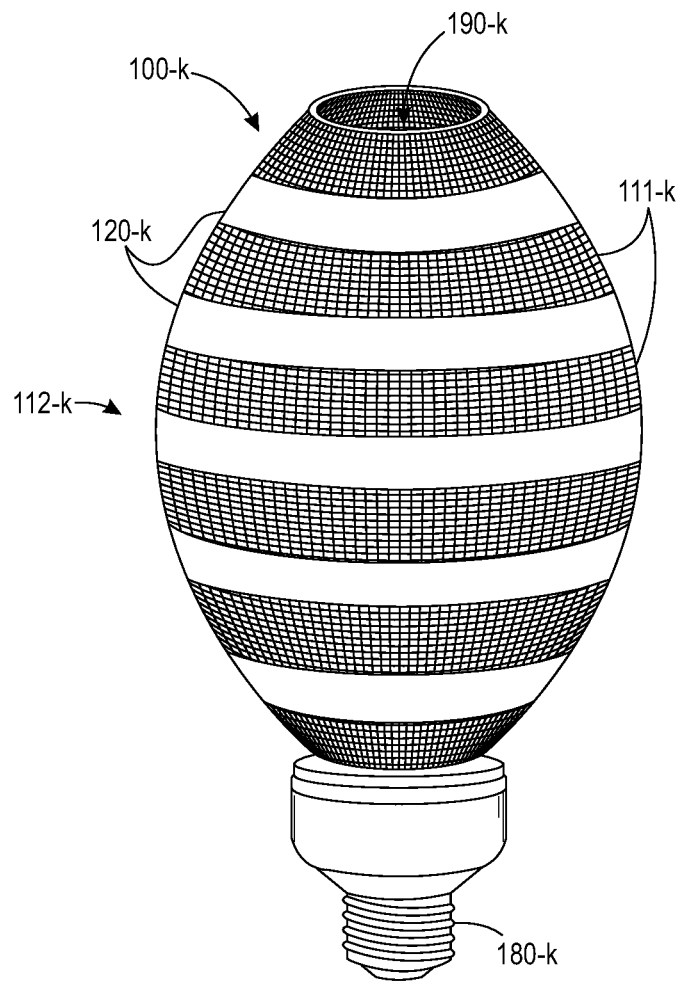
Figure 1L:
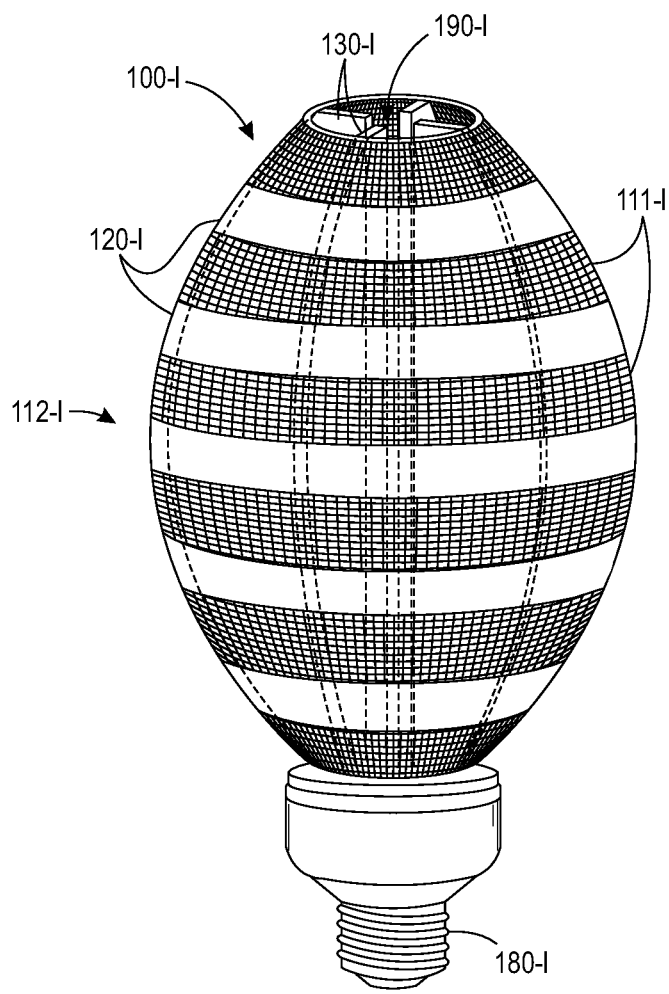

In some embodiments, the substrate of an LED assembly comprises a flexible printed circuit board and the LEDS comprise surface mount LEDs. Some embodiments, as shown in FIGS. 1K and 1L, the LEDs 121-k, 121-l, comprise micro LEDs. Micro LEDs are many LEDs formed together in an integrated circuit, which may be flexible.

In some implementations, one or more coatings may be disposed over at least a portion of the LED assemblies 120-a-120-l. In various configurations, the coating has a surface that is exposed to ambient air, e.g., outside or inside the open volume 190-a-190-l. The coating may comprise one or more of ceramic, glass, polymer, plastic, and metal powder. For example, the coating can be configured to provide certain optical and/or thermal properties. In some cases, coating surface has a surface texture that provides a surface area at least three times greater than an untextured surface of the same size. The coating can be configured to transmit and/or scatter the light generated by the LEDs. The coating may form a lens configured to direct the light emitted by the LEDs. The LED light bulb can additionally or alternatively include at least one thermally diffusive layer or coating disposed on the support structure.

According to some aspects, the LED light bulb may further include an optical sheet disposed over the LEDs. The optical sheet can be configured to diffuse the light emitted by the LEDs. The optical sheet can be configured guide the light emitted by the LEDs along a path through the optical sheet before transmitting the light out of the optical sheet. In some implementations, the optical sheet is embedded in a coating disposed over the LED assemblies.

Figure 2A:
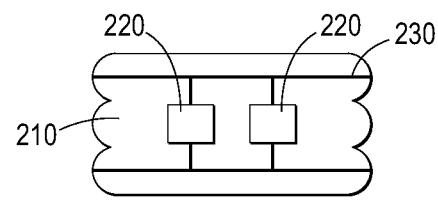
FIGS. 2A and 2B illustrate portions of LED assemblies that include a flexible substrate 210 and LEDs 220 spaced apart along the flexible substrate.
Figure 2B:
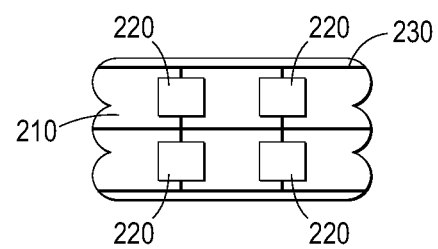

FIGS. 2A and 2B illustrate portions of LED assemblies that include a flexible substrate 210 and LEDs 220 spaced apart along the flexible substrate. In FIG. 2A, the LEDs 220 are arranged on the substrate 210 in a single row. FIG. 2B illustrates another LED assembly formation in which there are two rows of LEDs 220 arranged on the flexible substrate 210. It will be appreciated that the LEDs may be arranged along the flexible substrate in any convenient pattern. The pattern may be selected to provide desired light distribution and/or heat dissipation specifications.

Figure 3A:
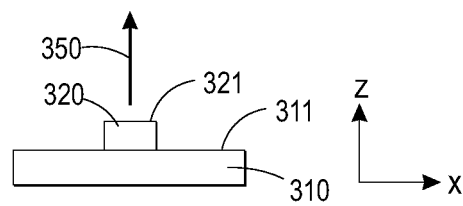
FIGS. 3A through 3C show a variety of arrangements of LEDs that with light emitting surfaces parallel or normal to the surface of the flexible substrate.
Figure 3B:
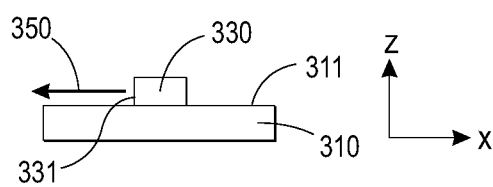
Figure 3C:
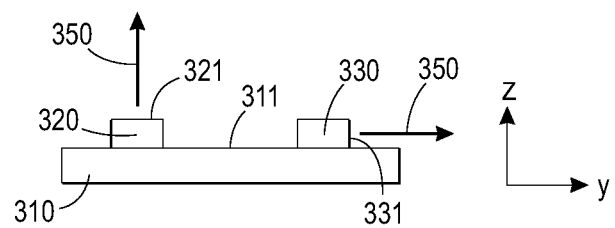

The flexible substrate 210 may be a flexible circuit board that facilitates electrical connection between the LEDs 220 and the base electronics. As shown in FIGS. 2A and 2B, electrical conductors 230 are disposed in or on the flexible substrate and run along the length of the flexible substrate to electrically connect each of the LEDs 220 to the base electronics disposed within the base (shown in FIGS. 1A and 1B). The LEDs 220 may comprise surface mount LEDs that are soldered to the flexible substrate or may be micro LEDs Turning now to FIGS. 3A and 3B, LEDs emit light from a surface or edge, as conceptually illustrated by arrows 350. As shown in FIG. 3A, one or more of the LEDs 320 may be arranged on the flexible substrate 310 so that the light emitting surface or edge 321 of the LED 320 is substantially parallel to a major surface 311 of the flexible substrate 310. As shown in FIG. 3B, in some cases one or more of the LEDs 330 may be arranged on the flexible substrate 310 so that the light emitting surface or edge 331 of the LED 330 is substantially perpendicular to a major surface 311 of the flexible substrate 310. In some configurations, LEDs 320, 330 may be arranged together on the flexible substrate 310 so that some of the LEDs 320 emit light 350 from a light emitting surface 321 that is about parallel with the major surface 311 of the flexible substrate 310 and some LEDs 330 emit light 350 from a light emitting surface 331 that is about perpendicular or at an angle to the major surface 311 as shown in FIG. 3C.

Figure 4:
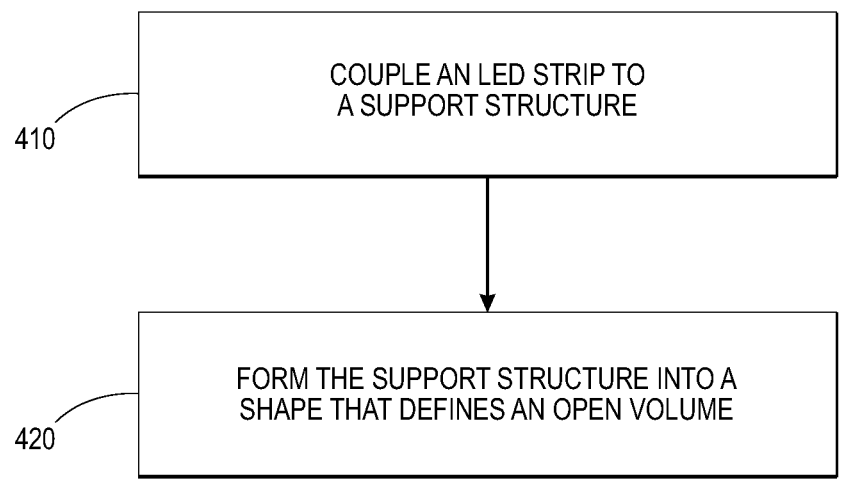
FIG. 4 is a flow diagram illustrating a process that can be used in forming an LED light bulb according to embodiments described herein.

According to various LED light bulb configurations, one or more LED assemblies may be attached to and/or integrated into a support structure. FIG. 4 is a flow diagram that shows a process for forming an LED lighting device according to some embodiments. An LED assembly comprising a substrate having plurality of electrically interconnected LEDs disposed thereon is coupled 410 to a support structure. The support structure is formed 420 into the shape of the light bulb and defines a luminous surface and an open volume. The shape of the LED light bulb allows for ventilation around and between segments of the one or more LED assemblies. The luminous surface provides a desired distribution of light emitted from the LEDs. In some embodiments, the forming and attaching comprise forming the support structure into the predetermined shape before attaching the at least one LED assembly. In alternate embodiments, the forming and attaching comprises forming the support structure into the predetermined shape after attaching the at least one LED assembly. Forming the support structure may comprise one or more of folding, bending, molding, and curing. In cases wherein the support structure is hardened to a rigid or semi-rigid condition by curing, the support structure is cured after being formed into the predetermined shape.

According to various implementations, the LED assembly is arranged lengthwise along the elongated support structure and can be attached thereto, e.g., by lamination, adhesion, or other suitable processes. In some cases, the width of the LED assembly is equal to (or about equal to) the width of the support structure. The support structure is bent, folded, molded and/or cured into the shape of the light bulb. The support structure is mechanically attached to the base which holds the support structure upright, in many cases without need for additional support. The LEDs are electrically coupled to the base electronics.

In some implementations, the flexible LED assembly can be mechanically wound in a spiral on a cylindrical form. The cylindrical form is cut, e.g., laser cut, or mechanically machined along the edges of the flexible substrate so that underlying form (with the LED assembly attached thereto) can be expanded to form the light bulb shape. The flexible LED assembly is then supported on the rigid or semi-rigid form, which has been spiral cut and expanded.

Suitable materials for the support structure comprise materials that can be formed into the desired light bulb shape, such as metals, plastics, ceramics curable resins, and/or composite materials that include layers, portions, and/or mixtures of different materials. If metal is used for the support structure, the metal can be anodized, e.g., to enhance durability or the metal can be oxidized. In some embodiments, a surface of the support structure may be textured through embossing, etching, sandblasting, etc., to increase the effective surface area of the support structure surface. The surface texturing process can impart a significant increase in effective surface area. For example, the texture of the surface of the support structure may have a surface roughness that provides an effective surface area that is at least equal to three times the surface area of the same material of the same size that does not have the texturing treatment. The surface texture may provide additional heat dissipation and/or may provide additional light diffusion or light scattering when compared with an untextured surface. For example, the surface roughness (Ra) after texturing may be equal to at least 2 to 3 times that of an untextured surface of the same size.

The support structure is configured to support the LED assembly as well as to provide heat dissipation and/or light management for the LED light bulb. In some cases, the support structure is a heatsink. Thermally diffusive layers, e.g. one or more layers of materials having thermal conductivity greater than about 100 W/mK, greater than about 250 W/mK, or even greater than about 300 W/mK can be applied to one or both surfaces and/or one or both edges of the support structure. The support structure (and/or a coating disposed thereon) may be used to diffuse, reflect, transmit, homogenize and/or blend the light emitted by the individual LEDs to provide a specified light spectral and/or intensity distribution. For example, the support structure may have a reflective surface, may be coated with a reflective layer, may be textured to diffuse light or may otherwise be arranged to manage light emitted by the LEDs. For embodiments in which the support structure has a reflective surface or a reflective layer is disposed on the support structure, the reflectivity of the surface or layer may be greater than about 85% at the wavelengths of light emitted by the LEDs, e.g., in a range of about 320 nm to about 700 nm. For embodiments in which the support structure has a light transmissive surface or a transmissive layer is disposed on the support structure, the transmissivity of the surface or layer may be greater than about 85% at the wavelengths of light emitted by the LEDs, e.g., in a range of about 320 nm to about 700 nm.

Additionally or alternatively, the support structure surface (or a coating layer disposed thereon) may be configured to provide light scattering to the lighting device. In some cases, the light scattering may be provided by a coating disposed on the support structure and/or the LED assembly. Suitable coatings may include, for example, reflective metals, glass, translucent plastics, etc. According to various embodiments, more than one type of coating is used to provide the lighting structure with various characteristics. For example, one coating may be selected to dissipate heat generated by the LEDs. Another coating may be selected to provide one or more optical characteristics. The coating may be applied to a surface of one or both of the support structure and the LED assemblies.

In some embodiments, the method includes arranging an optical sheet over a light emitting surface of the LEDs. In some embodiment, an optical or thermal layer can be deposited on one or both of a major surface of the LED assemblies and a major surface of the structural support. For example, the deposited layer can be optically or thermally diffusive. If an optical layer is deposited, the optical layer may comprise a material that provides one or more of light transmission, reflection and diffusion.

Figure 5A:
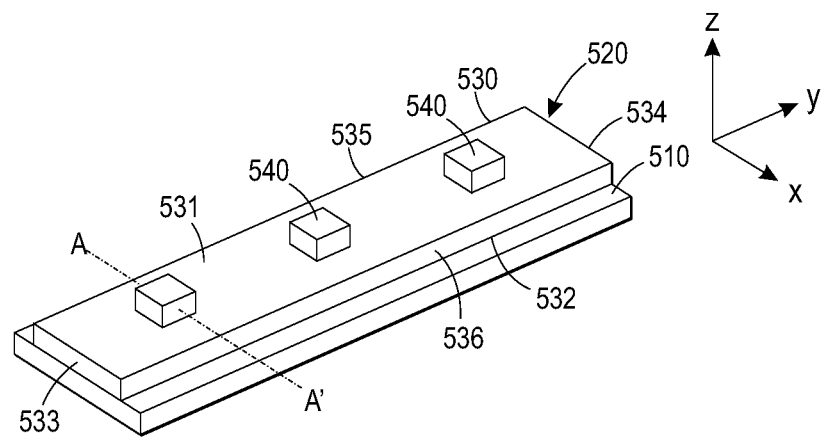
FIGS. 5A-5G are perspective and cross section diagrams that illustrate various support structure/LED assembly configurations.

FIGS. 5A-5G are perspective and cross section diagrams that illustrate various support structure/LED assembly configurations. In some cases the support structure is substantially flat as in the example illustrated in the perspective view of FIG. 5A. In this diagram, which shows a portion of a support structure and LED assembly configuration, an LED assembly 520 comprising a flexible substrate 530 and LEDs 540 is coupled to one flat surface of the support structure 510. FIG. 5A illustrates the orientation of the LED assembly with respect to reference coordinates. The same orientation is used for diagrams that follow. The length of the flexible substrate 530 (along the y direction in FIG. 5A) is much greater than its width (along the x direction in FIG. 5A). Similarly, the length of the support structure 510 (along the y direction in FIG. 5A) is much greater than its width (along the x direction in FIG. 5A). The flexible substrate 530 is arranged lengthwise along the support structure as shown in FIG. 5A. The lengths and/or widths of the flexible substrate and the support structure may be about equal as shown in FIG. 5A. The flexible substrate 530 has a first major surface 531, an opposing major surface 532, a major edge 535, an opposing major edge 536, a minor edge 533, and an opposing minor edge 534.

Figure 5B:
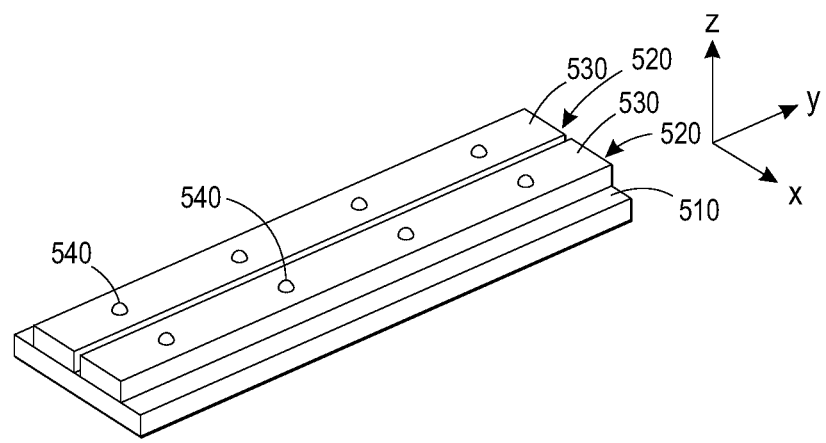

In some embodiments, illustrated by FIG. 5B, more than one LED assembly 520 is coupled to the support structure 510. The examples according to FIGS. 5A and 5B include a support structure that is planar or flat along the x direction across the width of the support structure. This configuration is denoted herein as a "flat support structure" and it will be appreciated that this refers to a support structure that is planar across its width (i.e., its minor dimension) whereas the support structure may be non-flat along its length (i.e., its major dimension). In other words the support structure may be folded, molded, bent or otherwise formed along its length to form the light bulb shape, such as the shapes illustrated in FIGS. 1A and 1B.

Figure 5C:
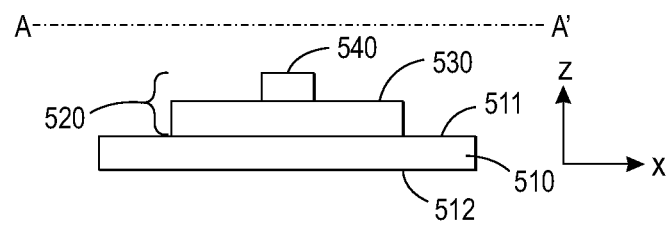

FIG. 5C is a cross sectional diagram of the support structure/LED assembly configuration shown in FIG. 5A, where the cross section is taken along dashed line A-A'. The support structure may optionally include one or more textured surfaces 511, 512.

Figure 5D:
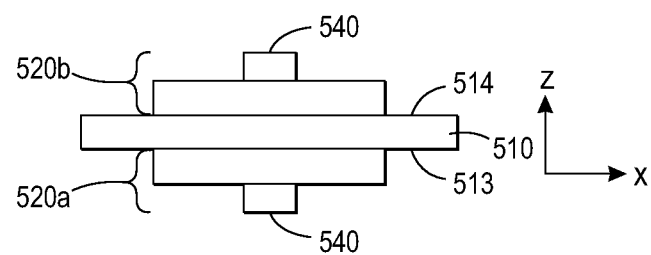

FIG. 5D shows a flat support structure 512 with a first LED assembly 520a coupled to a first surface 513 of the support structure 510 and second LED assembly 520b coupled to a second surface 514 of the support structure that is opposite to the first surface.

Figure 5E:
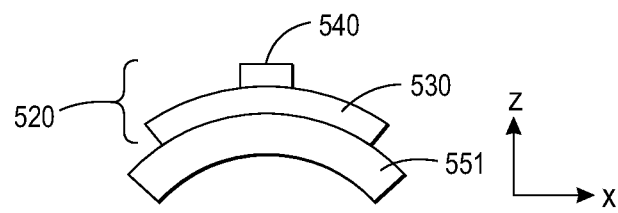
Figure 5F:
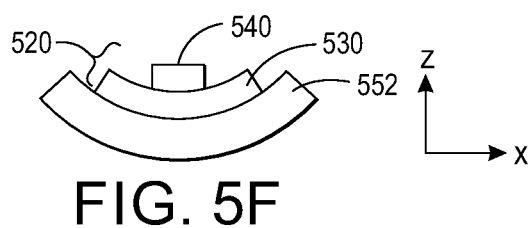

The support structure may be a convex support structure 551 (shown in FIG. 5E) or may be a concave support structure (shown in FIG. 5F). FIG. 5E illustrates an example in which the LED assembly 520 (comprising flexible substrate 530 and LEDs 540) is coupled to the convex surface of a support structure 551. FIG. 5F shows the LED assembly 520 coupled to a concave surface of a support structure 552.

Figure 5G:
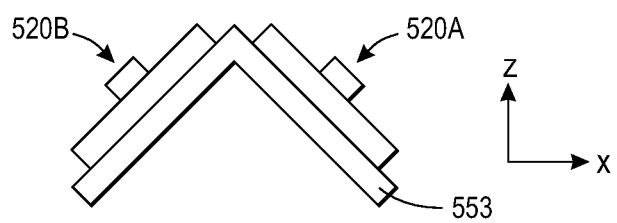

In some cases, multiple LED assemblies can be disposed on different facets of the support structure, as illustrated in FIG. 5G. A triangular support structure 553 supports a first LED assembly 520a on a first facet 553a and a second LED assembly 520b on a second facet 553b. It will be appreciated that the examples provided herein are only a few of the many support structure/LED assembly configurations that are possible.

Figure 6:
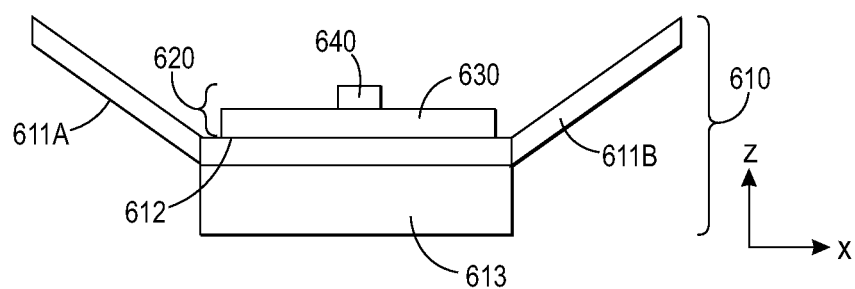
FIG. 6 illustrates a support structure/LED assembly combination where the support structure includes multiple layers and portions.

As previously mentioned, the support structure may comprise metal, metal alloy, plastic or any other material suitable for forming into the desired LED light bulb shape. In some cases, the support structure may be composite structure that includes multiple layers, multiple portions and/or multiple materials. The different layers, portions or materials of a composite support structure can impart different characteristics to the support structure. For example, a layer, portion, and/or material may be used to impart structural characteristics, a layer, portion, and/or material may be used to additionally impart structural and thermal characteristics, a layer, portion, and/or material may be used to impart structural and optical characteristics. In some cases, a composite support structure may comprise a layer or component that includes multiple materials, e.g., metal particles embedded in a plastic matrix. In some case, a composite support structure may comprise layers and/or portions made of different materials, as illustrated in FIG. 6. Each of the layers and portions shown in FIG. 6 can contribute to the structural characteristics of the structural support.

FIG. 6 illustrates a support structure/LED assembly combination where the support structure 610 is a composite of multiple layers 612, 613 and portions 611a, 611b. An LED assembly 620 (including a flexible substrate 630 and LEDs 640) is disposed on the support structure 610. The support structure includes a relatively thick, non-metallic, e.g., plastic, layer 613 that provides structural support, a relatively thin metallic layer 612 that contributes to the structural characteristics of the support 610 and also provides dissipation and/or distribution of heat generated by the LEDs 640. Reflective portions 611a, 611b (e.g. plastic and/or metal reflectors) contribute to the structural characteristics of the support 610 and reflect the light emitted by the LEDs 640.

Figure 7:
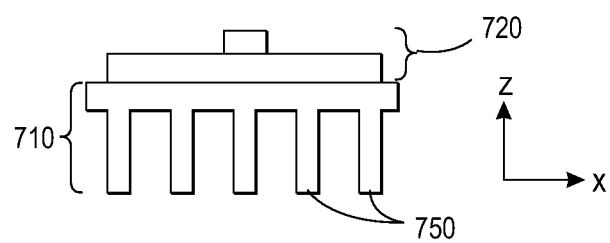
FIG. 7 shows a support structure with heat sinking fins.

As previously discussed, the structural support may include surface texture that provides desired characteristics. Additionally or alternatively, the support structure may comprise features or portions that provide desired characteristics, such as the reflector portions 611a, 611b shown in FIG. 6. FIG. 7 shows another example of support structure with optional features. In this example, the support structure 710 includes heat sink fins 750 disposed on a surface of the support structure opposite to the surface on which the LED assembly 720 is arranged. The fins 750 may run along the width and/or length of the support structure 710 and may be designed to impart one or both of rigidity and heat removal capacity to the support structure.

Figure 8:
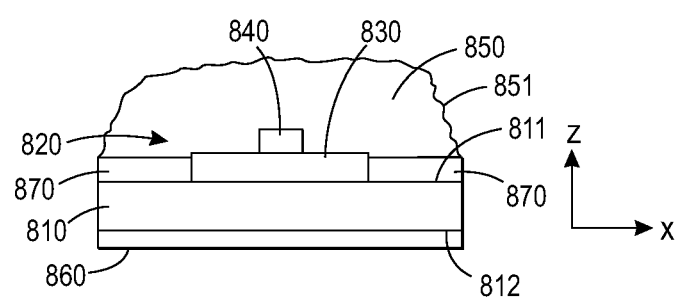
FIG. 8 depicts a support structure that includes an optical overcoat and a thermal layer.

Optional coatings, layers and/or sheets (that may or may not contribute to the structural characteristics) may be used in conjunction with the support structure and LED assembly. FIG. 8 illustrates several optional coatings that may be used. Portions of the LED assembly 820 and/or portions of the support structure 810 may be coated with an optical coating 850 that covers at least a portion of the flexible substrate 830 and/or some of the LEDs 840. For example, the optical coating 850 may serve to diffuse or homogenize the light that emerges from the LEDs 840 so that the LED light bulb provides a light distribution that approaches or is comparable to that of an incandescent light of similar form factor and luminosity. The coating 850 may have a surface texture 851 that provides for heat dissipation and/or light diffusion. As previously discussed, the surface texture 851 can provide an effective surface area that could be greater than three times the surface area of an untextured surface of the same material and of the same size and shape.

The configuration of FIG. 8 may include a thermally conductive layer 860 disposed on the support structure 810. In this particular example, the LED assembly is disposed along a first surface 811 of the support structure 810 and the thermally conductive layer 860 is disposed on an opposing second surface 812 of the support structure 810. In other configurations, a thermally conductive layer may be disposed on the same surface as the LED assembly or a thermally conductive layer may be disposed on both surfaces of the support structure.

The configuration shown in FIG. 8 includes a phosphor layer 870 disposed on the first surface 811 of the structural support 810. The phosphor layer comprises a fluorescent material that may emit light at a different wavelength than the light emitted by the LEDS. The light emitted by the LED and the phosphor layer, may provide a broader spectral characteristic for the light that emerges from the LED light bulb. For example, the LEDs may emit blue light and a yellow phosphor may be coated on the structural support and/or embedded in the coating 850.

Figure 9A:
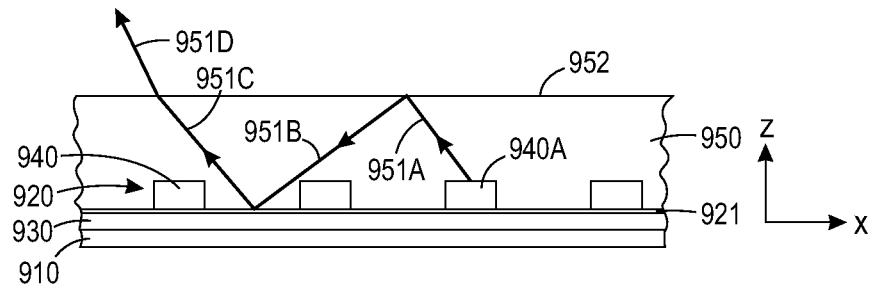
FIGS. 9A and 9B illustrate light guiding using an optical coating and/or optical sheet disposed over the light emitting side of the LEDs.
Figure 9B:
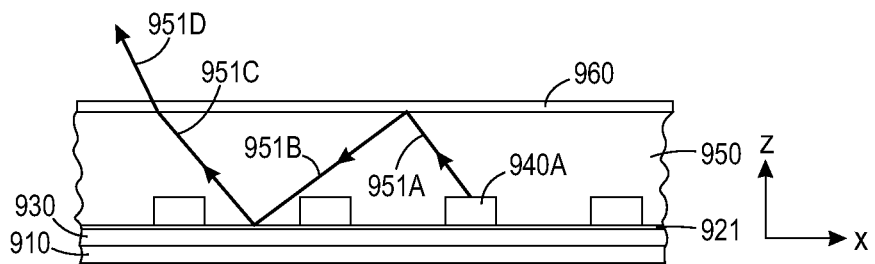

In some embodiments, an optical coating and/or sheet may be disposed over the LEDs as a waveguide to guide the light for a distance along the LED assembly until the light is coupled out of the waveguide. FIG. 9A shows a structural support 910 having a LED assembly 920 disposed thereon. A coating 950 is disposed over the LEDs 940. The difference in the index of refraction of the coating 950 and air at the optical coating/air interface 952 provides total internal reflection (TIR) at the interface 952 for at least some of the light emitted by the LEDs 940. FIG. 9A illustrates light beam 950 that emerges from LED 940a and is guided between the coating surface 951 and the flexible substrate 930 for a distance. Arrow 951a represents light that emerges from LED 940a. The light is reflected along arrow 951b at the interface 952. The light is reflected again at the surface of the flexible substrate 930 (which may include reflective coating 921) along arrow 951c. When the angle of the light incident of the coating/air interface is less than the critical angle for TIR, the light eventually emerges from the coating along arrow 951d. FIG. 9B is similar in many respects to FIG. 9C. FIG. 9B illustrates an optical sheet that may overlie the LEDs to facilitate guiding or waveguiding the light emitted by the LEDs. In this example, the interface between the optical sheet and air or between the optical sheet and the coating provide a TIR interface for the emitted light.

Figure 9C:
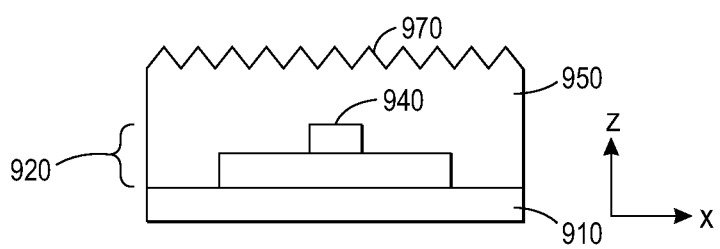
FIGS. 9C and 9D illustrate coatings that provide optical features such as linear prisms, lenses, and/or lenticular structures.
Figure 9D:
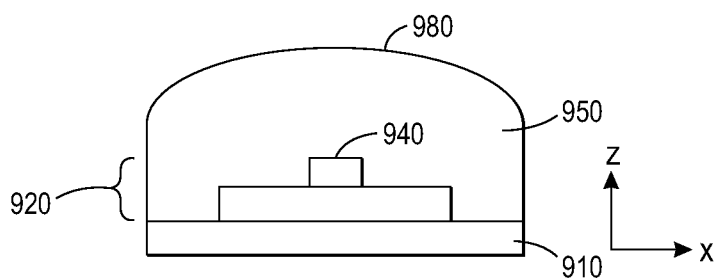

As illustrated by FIGS. 9C and 9D, an optical coating and/or optical sheet may form or comprise a light directing surface with various surface features 970, 980 such as linear prisms 970 and/or lenses or lenticular structures 980 that direct the light emitted from the LEDs.

Figure 10:
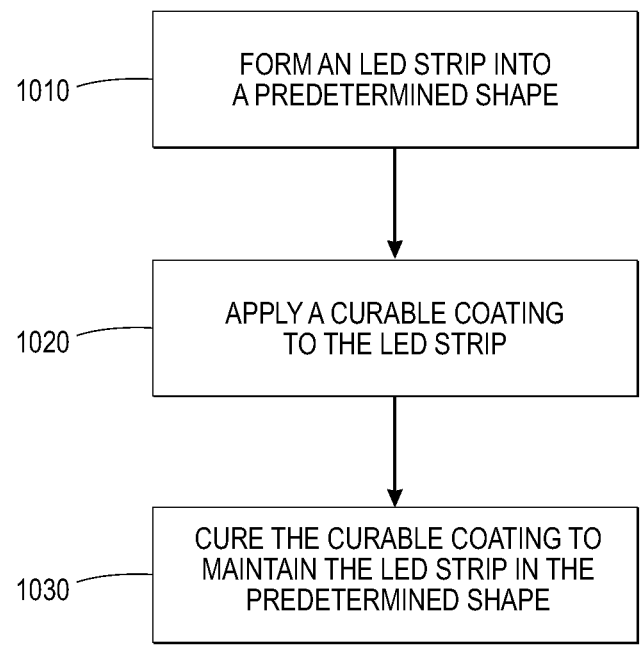
FIG. 10 is a flow diagram illustrating a process involving forming and maintaining an LED assembly into a predetermined shape using a curable coating.

In some embodiments, the LED assembly is formed into a predetermined shape and a curable coating is disposed over at least a portion of the LED assembly. After curing, the cured structural coating is used to maintain the LED assembly in the predetermined shape. FIG. 10 is a flow diagram that describes a process of forming an LED light bulb in accordance with some embodiments. An LED assembly comprising a flexible substrate with LEDs disposed thereon is formed 1010 into a predetermined shape. For example, the LED assembly may be placed in the shape of a spiral that is similar in size and overall shape to an incandescent light bulb of equivalent luminosity. A curable coating that can be hardened into a rigid or semi-rigid support is applied 1020 to the LED assembly, e.g., by various coating processes or by overmolding. The curable coating may contain or be a cureable polymer, a curable plastic, or a cureable composite. A curable composite can include a resin that includes particles in a curable polymer matrix. The particles may provide or enhance various optical or thermal properties of the cured structural coating. For example, metal particles embedded in a curable polymer matrix may provide increased heat dissipation for the heat generated by the LEDs. Optical particles embedded in the matrix may increase light scattering (and/or other optical properties). The curable coating may comprise a coating that is curable by thermosetting, radiation exposure (such as UV radiation), electron beam exposure, and/or other types of curable coating. Prior to coating, the cureable coating has viscosity suitable for coating or overmolding the LED assembly. The curable coating may be applied by any suitable process, for example, by overmolding, dip coating, spray coating and/or slit die coating. The curable coating bonds or adheres to the flexible substrate. The curable coating is cured 1030, and after curing, the cured structural coating serves as a rigid or semi-rigid support that maintains the LED assembly in the predetermined shape. The coating can be cured by any appropriate process depending on the material used for the coating. For example, curing may involve thermosetting, heating, cooling, applying pressure, chemicals, radiation, e.g., ultraviolet radiation, electron beam, and/or other curing processes.

According to some embodiments, the light produced by the LEDs on the LED assembly is used to cure the coating and thus set the shape of the LED light bulb. In some cases, the curable coating may be cured by cooling the coating so that is solidifies on, over, or around the LED assembly.

In some approaches, the LED assembly may be coated before it is placed in the predetermined shape. After coating, the LED assembly is placed in the predetermined shape and the curable coating is subsequently cured. In some approaches, the LED assembly is placed in the predetermined shape first, after which the LED assembly is coated with the cureable coating.

The cured structural coating may partially or fully cover the LED assembly. Depending on the material used for the structural coating, the structural coating can provide thermal and/or light management for the LED light bulb. In some cases, the structural coating can dissipate heat generated by the LEDs. In some cases, the structural coating can provide various optical properties. For example, the structural coating can be an optical reflector, an optical diffuser, a scattering medium, and/or a waveguiding medium for controlling light output. In some embodiments the structural coating can be used in conjunction with additional coatings or layers.

Figure 11A:
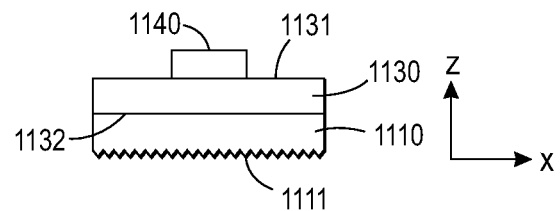
FIGS. 11A through 11F show various configurations that incorporate a cured structural coating.

FIGS. 11A through 11F show various configurations that incorporate a cured structural coating. Each of FIGS. 11A through 11F shows a cross section along the width (x direction) of the flexible substrate 1130. In FIG. 11A, LEDs 1140 are disposed on a major surface 1131 of the flexible substrate 1130 and the cured structural coating 1110 is disposed on an opposing major surface 1132 of the flexible substrate 1130. Optionally, a surface 1111 of the cured structural coating may be textured to provide an increased effective surface area for light and/or heat diffusion as previously discussed.

Figure 11B:
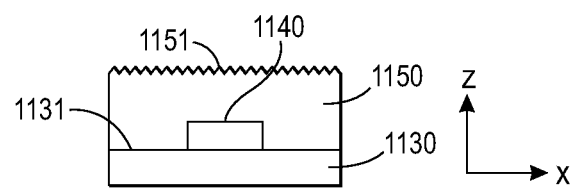
Figure 11C:
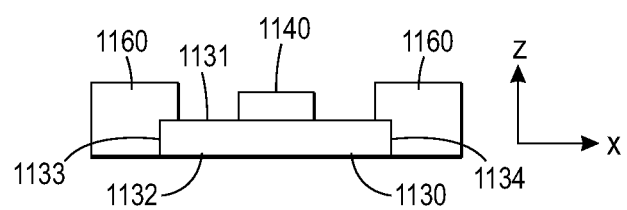

FIG. 11B shows a configuration wherein the cured structural coating 1150 is disposed on the same surface 1131 of the flexible substrate 1131 as the LEDs 1140. Optionally, a surface 1151 of the cured structural coating may be textured.

In some configurations, the structural coating is applied to one or more edges of the flexible substrate. In these configurations, the structural coating may also be applied to one or both surfaces of the flexible substrate so that it covers a majority (greater than 50%) or a substantial majority (greater than 75%) of the surface area of one or both flexible substrate surfaces. In some embodiments, depicted in FIG. 11C, the structural coating 1160 covers the edges 1133, 1134 of the flexible substrate 1130 and covers less than 25% of the first and/or second major surfaces 1131, 1132.

Figure 11D:
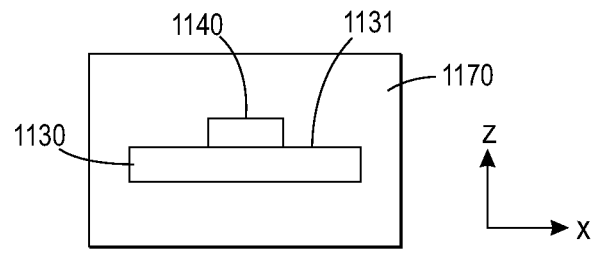
Figure 11E:
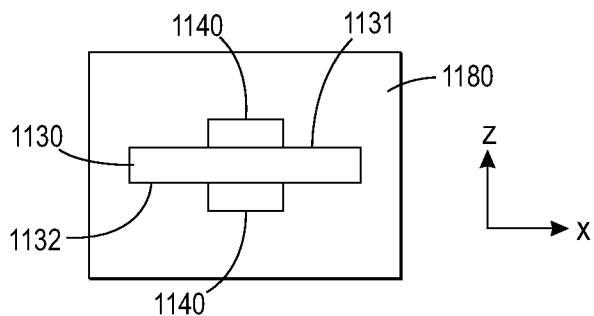
Figure 11F:
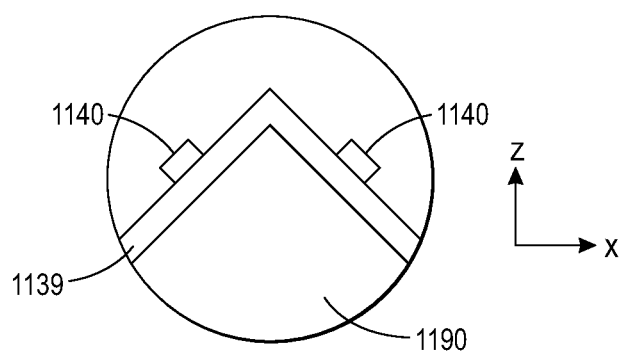

FIGS. 11D through 11F illustrate configurations wherein the structural coating 1170, 1180, 1190 completely encloses the LED assembly. In FIG. 11D, LEDs 1140 are disposed on a first major surface 1131 of the flexible substrate 1130. In FIG. 11E, LEDs 1140 are disposed on both major surfaces 1131, 1132 of the flexible substrate. FIG. 11F provides an example of a flexible substrate 1139 that is not flat along the x direction. LEDs 1140 are disposed on the flexible substrate 1139 which is enclosed by the cured structural coating 1190.

Figure 12A:
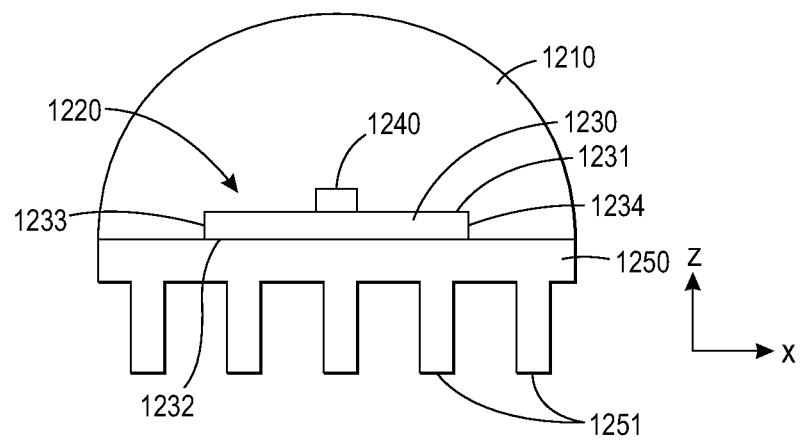
FIGS. 12A and 12B provide examples of configurations that include coatings and structures that can optionally be used in conjunction with a cured structural coating.

The cured structural coating may optionally be used in conjunction with additional coatings and/or layers. The optional layers may impart thermal or optical characteristics to the LED light bulb. A few examples of configurations that include optional coatings/layers are provided in FIGS. 12A and 12B, although it will be apparent to those skilled in the art upon reading this disclosure that many other configurations are possible. FIG. 12A shows an LED assembly 1220 comprising LEDs 1240 disposed on a first major surface 1231 of a flexible substrate 1230. A cured structural coating 1210 overcoats the LEDs, 1240, the first major surface 1231, and the edges 1233, 1234 of the flexible substrate 1230 and maintains the LED assembly 1220 in a predetermined shape. A thermal management layer 1250, e.g., a heat dissipating layer including heat sink features 1251, e.g., fin-like heat sink features, is disposed along a second major surface 1232 of the flexible substrate 1230.

Figure 12B:
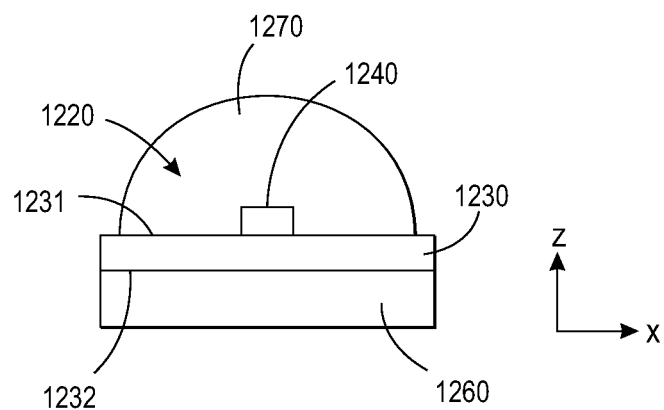

FIG. 12B illustrates the use of an optional optical coating 1270 in addition to the structural coating 1260. In this particular example, the cured structural 1260 coating is disposed on one major surface 1232 of the flexible substrate 1230 and an optical coating 1270 (e.g., providing light scattering, light diffusion, light reflection, waveguiding, etc., as previously discussed) is disposed on an opposing major surface 1231.

Note that the structural coating itself or an optical coating used in addition to the structural coating may be used to provide light waveguiding similar to the configuration previously illustrated in FIG. 9A. If a structural coating is used to maintain the LED assembly in the predetermined shape, the structural support 910 is not needed. The structural coating can be used along with an optical sheet to provide light waveguiding in a configuration similar to the configuration shown in FIG. 9B. Again, in configurations where the structural coating maintains the predetermined shape, the structural support is not needed. The structural coating may be formed or processed to provide various optical features, such as the linear prisms and lenticular structures shown in FIGS. 9C and 9D, respectively.

Systems, devices, or methods disclosed herein may include one or more of the features, structures, methods, or combinations thereof described herein. For example, a device or method may be implemented to include one or more of the features and/or processes described herein. It is intended that such device or method need not include all of the features and/or processes described herein, but may be implemented to include selected features and/or processes that provide useful structures and/or functionality.

In the detailed description, numeric values and ranges are provided for various aspects of the implementations described. These values and ranges are to be treated as examples only, and are not intended to limit the scope of the claims. For example, embodiments described in this disclosure can be practiced throughout the disclosed numerical ranges. In addition, a number of materials are identified as suitable for various facets of the implementations. These materials are to be treated as exemplary, and are not intended to limit the scope of the claims.

The foregoing description of various embodiments has been presented for the purposes of illustration and description and not limitation. The embodiments disclosed are not intended to be exhaustive or to limit the possible implementations to the embodiments disclosed. Many modifications and variations are possible in light of the above teaching.

What is claimed is:

1. A light emitting diode (LED) light bulb, comprising:
   a base;
   at least one support structure coupled to the base and formed into a shape that defines contours for a luminous surface and an open volume;
   at least one LED assembly comprising two or more electrically connected LEDs, the LED assembly attached to and in physical contact with the support structure along a length of the support structure to form the luminous surface, wherein the support structure has openings between neighboring segments of the LED assembly; and
   a coating disposed over at least a portion of the LED assembly, the coating having a surface that is exposed to ambient air, the coating surface having a surface texture that provides a surface area at least three times greater than an untextured surface of the same size, wherein a light output per surface area of the LED light bulb is between about 0.3 lumens and 30 lumens per cm² of an exterior surface area of the LED light bulb.

2. The LED light bulb of claim 1, wherein a volume defined by the luminous surface has a sphericity greater than about 0.7.

3. The LED light bulb of claim 1, wherein the support structure comprises a material that has a thermal conductivity greater than about 100 W/mK.

4. The LED light bulb of claim 1, wherein the support structure includes cooling fins configured to dissipate heat generated by the LEDs.

5. The LED light bulb of claim 1, wherein the support structure has a reflectivity greater than 85% for wavelengths between about 320 nm and 700 nm.

6. The LED light bulb of claim 1, wherein overall dimensions of the LED light bulb are similar to an incandescent light bulb of equivalent luminosity.

7. The LED light bulb of claim 1, wherein the LED assembly comprises a single elongated support element, the single elongated support element coupled to a single LED assembly.

8. The LED light bulb of claim 1, wherein the support structure has a first major surface and an opposing a second major surface and each of the LEDs has a light emitting surface or edge that is substantially perpendicular to major surface of the flexible substrate.

9. The LED light bulb of claim 1, wherein the support structure has a first major surface and an opposing second major surface and each of the LEDs has a light emitting surface or edge that is substantially parallel to major surface of the flexible substrate.

10. The LED light bulb of claim 1, further comprising an optical sheet disposed over the LEDs.

11. The LED light bulb of claim 10, wherein the optical sheet is configured to diffuse the light emitted by the LEDs.

12. A light emitting diode (LED) light bulb, comprising:
    a base;
    at least one support structure coupled to the base and formed into a shape that defines contours for a luminous surface and an open volume;
    at least one LED assembly comprising two or more electrically connected LEDs, the LED assembly attached to and in physical contact with the support structure along a length of the support structure to form the luminous surface, wherein the support structure has openings between neighboring segments of the LED assembly, wherein at least one major surface of the support structure has a surface texture that provides a surface area at least three times greater than an untextured surface of the same size.

13. A method of making a light emitting diode (LED) light bulb, comprising:
    forming a support structure into a predetermined shape, the predetermined shape defining contours of a luminous surface and an open volume;
    attaching at least one LED assembly to the support structure, the LED assembly comprising a substrate and a plurality of electrically connected LEDs spaced apart along the substrate;
    applying a coating to a surface of one or both of the support structure and the LED assembly; and
    treating a surface of one or both of the coating and the support structure, the treatment imparting a texture to the surface that provides a surface area at least three times greater than an untreated surface of the same size, wherein a light output per surface area of the LED light bulb is between about 0.3 lumens and 30 lumens per cm² of an exterior surface area of the LED light bulb.

14. The method of claim 13, wherein a volume defined by the luminous surface has a sphericity of greater than about 0.7.

15. The method of claim 13, wherein the forming and attaching comprise forming the support structure into the predetermined shape before attaching the at least one LED assembly.

16. The method of claim 13, wherein the forming and attaching comprise forming the support structure into the predetermined shape after attaching the at least one LED assembly.

17. The method of claim 13, further comprising arranging an optical sheet over a light emitting surface of the LEDs.

18. The method of claim 13, further comprising depositing an optical layer on the LED assembly, the optical layer comprising a material that provides one or more of light transmission, reflection and diffusion.

19. The method of claim 13, wherein forming the support structure into the predetermined shape comprises at least one of extruding, folding, bending, molding, and curing.

* * * * *